United States Patent [19]
Fossum et al.

[11] Patent Number: 5,665,959
[45] Date of Patent: Sep. 9, 1997

[54] SOLID-STATE IMAGE SENSOR WITH FOCAL-PLANE DIGITAL PHOTON-COUNTING PIXEL ARRAY

[75] Inventors: Eric R. Fossum, La Crescenta; Bedabrata Pain, Los Angeles, both of Calif.

[73] Assignee: The United States of America as represented by the Administrator of the National Aeronautics and Space Adminstration, Washington, D.C.

[21] Appl. No.: 673,014

[22] Filed: Jul. 1, 1996

Related U.S. Application Data

[63] Continuation-in-part of Ser. No. 372,640, Jan. 13, 1995, abandoned.

[51] Int. Cl.[6] .................................................. H01J 40/14
[52] U.S. Cl. .............................. 250/208.1; 250/214 LA; 348/298
[58] Field of Search ........................ 250/208.1, 214.1, 250/214 A, 214 L, 332, 338 H; 257/448, 239, 292, 294; 330/308; 348/294–298, 314, 317, 322

[56] References Cited

U.S. PATENT DOCUMENTS

| | | | |
|---|---|---|---|
| 4,363,963 | 12/1982 | Ando | 257/448 |
| 4,710,817 | 12/1987 | Ando | 348/310 |
| 4,929,913 | 5/1990 | Sato | 330/308 |
| 5,225,696 | 7/1993 | Bahraman | 250/208.1 |
| 5,236,871 | 8/1993 | Fossum et al. | 347/195 |
| 5,306,905 | 4/1994 | Guillory et al. | 250/208.1 |
| 5,461,425 | 10/1995 | Fowler et al. | 250/208.1 |

*Primary Examiner*—Que Le
*Attorney, Agent, or Firm*—John H. Kusmiss

[57] ABSTRACT

A solid-state focal-plane imaging system comprises an N×N array of high gain, low-noise unit cells, each unit cell being connected to a different one of photovoltaic detector diodes, one for each unit cell, interspersed in the array for ultralow level image detection and a plurality of digital counters coupled to the outputs of the unit cell by a multiplexer (either a separate counter for each unit cell or a row of N of counters time shared with N rows of digital counters). Each unit cell includes two self-biasing cascode amplifiers in cascade for a high charge-to-voltage conversion gain (>1 mV/e$^-$) and an electronic switch to reset input capacitance to a reference potential in order to be able to discriminate detection of an incident photon by the photoelectron (e$^-$) generated in the detector diode at the input of the first cascode amplifier in order to count incident photons individually in a digital counter connected to the output of the second cascode amplifier. Resetting the input capacitance and initiating self-biasing of the amplifiers occurs every clock cycle of an integratng period to enable ultralow light level image detection by the array of photovoltaic detector diodes under such ultralow light level conditions that the photon flux will statistically provide only a single photon at a time incident on any one detector diode during any clock cycle.

4 Claims, 5 Drawing Sheets

SOLID-STATE IMAGE SENSOR WITH FOCAL-PLANE DIGITAL PHOTON-COUNTING PIXEL ARRAY

This application is a continuation-in-part of application Ser. No. 08/372,640, filed Jan. 13, 1995, abandoned.

ORIGIN OF INVENTION

The invention described herein was made in the performance of work under a NASA contract, and is subject to the provisions of Public Law 96-517 (35 USC 202) in which the contractor has elected not to retain title.

TECHNICAL FIELD

The invention relates to a solid-state focal-plane imaging system which comprises an array of unit cells, each having a photodiode detector and an ultralow noise, high gain amplifier with readout multiplexing means in order to enable ultralow light level signal detection by individually counting photons received at the detector, thereby making the multiplexer free from read noise.

BACKGROUND ART

Many space-based telescopes and spectrometers require ultralow read noise in order to observe a large number of astrophysical phenomena associated with galactic and stellar evolution, high red-shift objects, etc. Detection of ultralow photon flux levels are also required in a large number of environments involving tactical and strategic military applications, such as night vision. Detection of faint objects require either extremely long integration times to build enough signal to be above the system noise floor, or image intensification using photo-multiplier tubes or microchannel plates (MCP). Both the photomultiplier approach and the MCP approach suffer from the ungainly requirements of large mass, high voltage, high power, high dead-times, small dynamic range and in the case of MCP, "scrubbing" for stability.

Flicker noise often limits the exposure time in conventional IR imaging systems, thus limiting detectability of ultralow level IR images. In a typical IR imaging system, the analog nature of the image signal integration and readout processes makes it susceptible to noise pick-up along the entire path of the image signal processing. The multiplexer noise, consisting of white noise in MOS transistors and unwanted clock pick-up, is typically around 10–20 electrons in low-noise systems. Multiplexers with subten-electron read noise are far and few between, and tend to suffer from large response nonuniformity and nonlinearity.

Detection of faint objects will be greatly enhanced by providing for readouts of signals from pixel cells with subelectron read noise. An object of this invention is to provide ultralow noise sensors in an array of pixel unit cells at a focal plane in which limitations due to read noise can be overcome by counting photons received within each pixel unit cell, and generating a one-bit digital signal from photons received per clock-pulse for integration by counting and making the readout system virtually noise free.

The array of unit-cell sensors may have a hybrid structure, similar in that respect to conventional IR sensors, with an important difference, besides the unit-cell realization itself, that the readout system comprises a novel multiplexer that is sensitive to single photoelectron signals. Such a hybrid solid-state sensor structure enables on-chip photon counting to take place directly for integration, thus greatly enhancing the capability of ultralow light level image detection.

On-chip digitization has been previously demonstrated [B. Fowler, A. El-Garnal, and D. Yang, "A CMOS area imager sensor with pixel level A/D conversion," *Digest of Technical Papers*, 1944 IEEE International Solid-State Circuits Conference, Vol. 37, pp. 226–227 and U.S. Pat. No. 5,461,425] but as realized was limited to detection of large signal fluxes, and was not amenable for solid-state photon-counting. Instead the image sensor was realized with phototransistors whose high conductivities are related to a high level of light. The analog signals thus generated at the phototransistors were converted to a serial bit stream by an on-chip A/D converter. That on-chip A/D approach is thus clearly useful only for normally high photon flux levels.

Another on-chip digitization system had been suggested earlier [U.S. Pat. No. 4,710,817] for a solid-state image sensor in which the photon flux at each pixel could be integrated digitally by an electronic digital counter. The readout process then would involve transfer of digital signals that are not as susceptible to noise and radiation interference as analog signals. Furthermore, a conventional analog-to-digital converter would not be required, which is another source of signal degradation. However, the photodetectors there were selected to be avalanche photodiodes or microchannel plates (MCP) which suffer from the ungainly requirements noted above in order to provide photoelectric signals of sufficient amplitude to drive the digital counters through conventional buffer amplifiers. That system was evidently not intended for use in ultralow flux level conditions where photons are generally received individually with an incidence of two or more arriving at about the same time being statistically so small during an integration period as to not distort the image over the short period of time they are individually counted. Instead, the flux level contemplated was so high that such incidence would be statistically high. In an attempt to improve contrast, the system was so designed that each photoelectric signal pulse created by a group of photons be converted to a number of distinct pulses in proportion to the pulse peak value and time of duration using a signal level detector and pulse generator circuit to inject into the integrating counter a proportional train of distinct pulses. That form of analog to digital conversion is at best an approximation of the true image photon flux and is clearly intended for use in relatively high photon flux conditions.

More discriminating PIN photon-flux detector arrays are commercially available for UV/visible photon-counting imaging devices from Hughes Technology Center (HTC), but they use conventional CCD architecture based on analog charge integration and analog pixel charge multiplexing for readout before analog-to-digital conversion. Thus, the HTC imaging device has much higher noise (>50 electron rms) than can be tolerated for many applications that require imaging under low level photon flux conditions. Consequently, such PIN photon flux detector arrays are not useful for many scientific and commercial applications that require accurate ultralow photon flux level detection.

Several astrophysics-missions with space-telescopes and spectrometers for the IR band have been planned by the National Aeronautics and Space Administration or are already in use. For example, in astronomy and astrophysics, infrared images of objects have led to discovery of several features that are hidden in other spectral bands using conventional CCD detectors. Satellites with IR detector arrays are being planned to explore temperatures in the upper atmosphere, conduct surveys of terrestrial minerals, water and agriculture, and record weather patterns. What is now needed is an array of digital-counting pixels for imaging in ultralow photon flux level conditions that prevail in some situations.

Medical researchers also use IR detector arrays as tools to evaluate skin diseases, circulatory and neurological disorders, breast cancer and neo-natal birth. IR detector arrays also have potential applications in industrial robotics, and are being used for industrial thermography (mechanical and electrical fault detection), high temperature and chemical process monitoring, spectroscopy, night vision and materials research. Some of these uses also require imaging under ultralow photon flux level conditions.

Because of these situations requiring ultralow photon flux level detection, reference will sometimes be made to an infrared focal-plane array (IRFPA) in the description of preferred embodiments of the present invention. However, other applications will require UV/visible detector arrays also sensitive to low photon flux level detection. Consequently, it is not intended that the concept of the invention be limited to infrared radiation. Thus, for "IR" in IRFPA, "UV/visible" FPA is to be appropriately assumed equivalent in the context that it is used. Similarly, wherever FPA is used, the reference to FPA is to be understood to be generic to IR and UV/visible focal-plane arrays since the present invention is suitable for use in other wavelength bands requiring ultralow photon flux level conditions that would require only the proper selection of the photoelectric conversion material to be used in the pixel array at the focal plane of an optical lens for the wavelength band of interest.

Like focal-plane arrays operating in UV/visible spectral bands, large IRFPAs are also required to operate with severe power dissipation, real estate and throughput constraints. Typical dimensions of an IRFPA readout unit-cell are 50 µm×50 µm in area, and typical maximum power dissipation is 100 µW/pixel. The low power dissipation requirement also imposes a constraint on the kind of detector that can be used. State-of-the-art IR detectors are photoconductive or photovoltaic detectors. Photo-conductive detectors require a quiescent current for operation, thus increasing focal plane power dissipation. On the other hand, a photovoltaic detector is essentially a reverse-biased diode requiring very low quiescent current for operation. Consequently, for low power, staring focal-plane arrays, a photovoltaic detector diode is preferred.

There are two major differences between UV/visible and infrared imaging focal-plane arrays. First, silicon, the most familiar and best understood photoelectron conversion material, cannot be easily used for detection of infrared radiation. This is because silicon has a bandgap energy of 1.12 eV. Therefore, a photon whose energy is less than 1.12 eV will not generate an electron-hole pair in a silicon photovoltaic detector, thereby preventing its use for detection of IR radiation. Thus, it can be seen that IRFPAs operating at 3–5 µm and 8–12 µm bands, require detector materials having band gap energy of 0.25 eV and 0.1 eV, respectively. In the absence of silicon photovoltaic detectors at these wavelengths, photovoltaic detectors are built on narrow band gap materials such as IV–VI compounds (lead salts), II–VI semiconductors (mercury salts), III–V semiconductors (indium and gallium salts). IR detectors are built on indium antimonide (InSb), a III–V compound, and mercury cadmium telluride (HgCdTe), a II–VI compound. IR detection in silicon is carried out at 3–5 µm bands by using a platinum silicide (PtSi) Schottky barrier diode (SBD) fabricated in an a-Si layer.

In SBDs, internal photoemission is responsible for exciting a photocurrent across the relatively small Schottky barriers. The quantum efficiency of PtSi in a SBD is extremely low, being in the range of 1–2%. The quantum efficiency can be increased somewhat by changing the thickness of PtSi or by using an alternate metal film such as $Pd_2Si$. However, the dark current is also increased as a result, often resulting in degradation of performance rather than an improvement. Other novel IR detector technologies exist, but all are constrained by the absence of efficient low-noise readout and multiplexer structures.

STATEMENT OF THE INVENTION

An object of the invention is to provide a focal-plane array comprising an array of N×N photodetector diodes connected to a digital photon-counting means for ultralow level image light detection and digital image pixel readout means for each pixel comprising separate CMOS buffer amplifiers that exhibit the following characteristics: low power (<1 µW per pixel average), high photoelectron charge to voltage conversion gain <1 mV/e⁻, low noise (<1 e⁻), small cell pitch (<30 µm), easy scalability (to 10 µm), self-biasing capability, sufficient gain uniformity (~10%) for multiple event discrimination, and bias current programmability. Any incident photon during the sampling period generates a photoelectron at the output of the detector diode connected to the input of the amplifier. That photoelectron changes the potential of the buffer amplifier's input capacitance. This change in potential causes the high-gain buffer amplifier to present a sufficiently large voltage change at the output of the amplifier to be above the system noise floor. This high voltage at the buffer amplifier output terminal is then sampled at the end of the clocked sampling period by electronic multiplexing means in response to a $\phi_{sel}$ clock pulse for connecting the output of the amplifier to a readout bus. Due to the ultrahigh gain of the buffer amplifier, the change in output at the bus ($\Delta V_{out}$) is sufficient to allow differentiating between the presence or absence of a photoelectron stored in the capacitance at the input of the buffer amplifier in order to increment the counter. The multiplexing means thus permits the counting of individual photoelectrons over an integration period to produce a digital output proportional to incident photon flux in an on-chip counter. The semiconductor chip is preferably a hybrid using a separate semiconductor material for two chips selected to be optimum for the photovoltaic type of detector diodes in one and the buffer amplifier and multiplexing circuit in the other chip bump bonded to the first to make connections between the output terminals of the detector diodes on one chip and the input terminals of the buffer amplifiers on the other chip with the photodetector diodes buffer amplifier D in one semiconductor chip and the multiplexing means and digital counters on the second semiconductor chip bump bonded to the first one of the hybrid.

The novel features that are considered characteristic of this invention are set forth with particularity in the appended claims. The invention will best be understood from the following description when read in connection with the accompanying drawings.

BRIEF DESCRIPTION OF THE DRAWINGS

FIG. 1b illustrates a monolithic focal-plane imaging array of pixels dispersed among an array of CMOS unit cells comprising high gain buffer amplifiers and detector diodes for a more direct connection between the photodetector diodes and input terminals of the high gain buffer amplifiers with CMOS accumulators over to one as in FIG. 1a.

DETAILED DESCRIPTION OF THE INVENTION

Figure 1A:
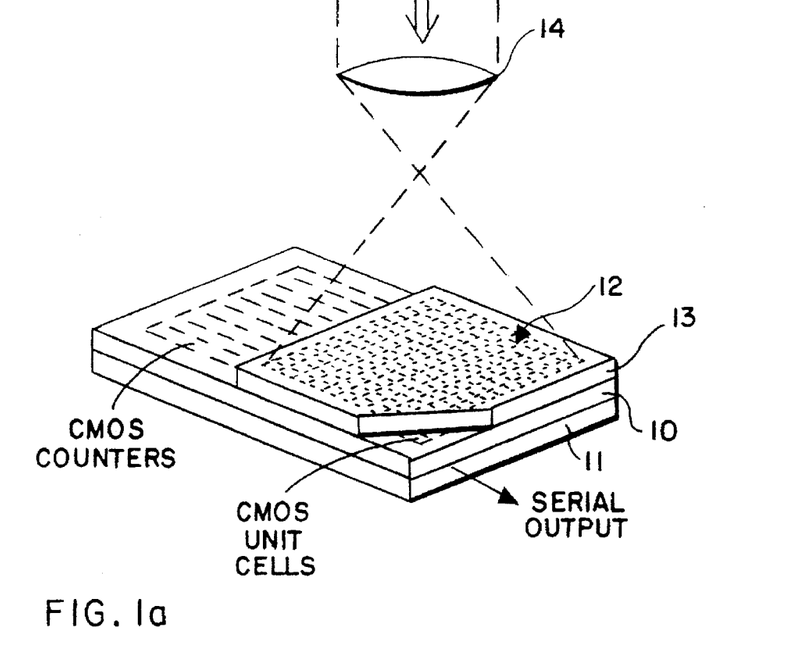
FIG. 1a illustrates a hybrid focal-plane imaging array of Photodetector diodes (pixels) formed in a layer of photoelectron conversion material by reticulating the layer into rows and columns of pixels and hybrid bump bonding that layer with a silicon layer having high gain CMOS buffer amplifiers and readout circuitry for digital integration by counting photons detected in a bank of CMOS accumulators (digital counters) prefabricated on the silicon layer.
Figure 2:
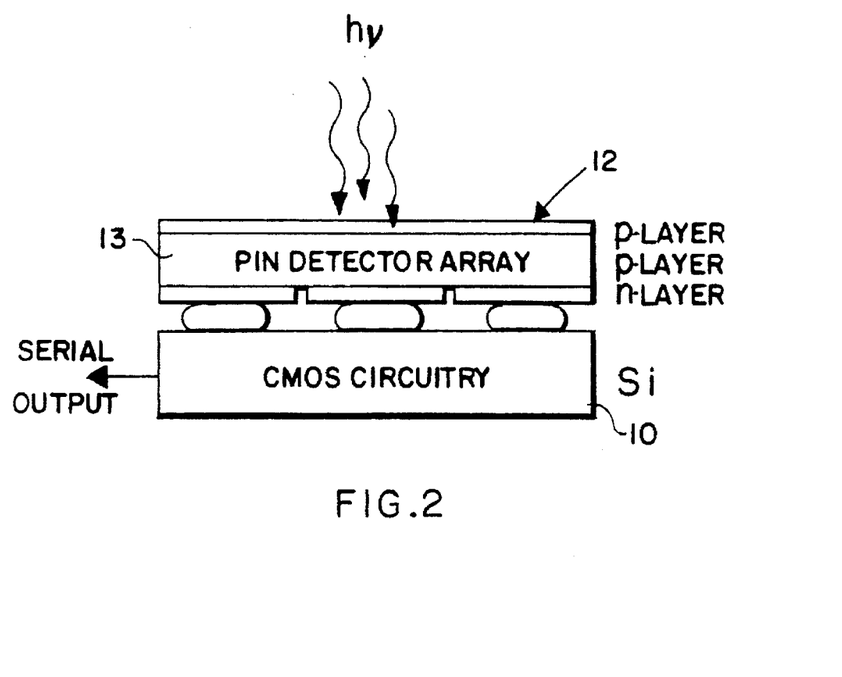
FIG. 2 illustrates in greater detail the implementation of the array of pixels in FIG. 1a as an array of detector diodes bump-bonded onto CMOS circuitry fabricated on the silicon layer for separate connection of each detector diode to a unit cell comprising a CMOS high gain, low power buffer amplifier having 1/f noise reduction capability for driving a CMOS digital counter.

Referring to FIG. 1a, a solid-state photon-counting imaging system employs unit cells developed on a silicon semiconductor layer 10 spitaxially grown on a substrate 11 for signal processing in a focal-plane array 12 of photovoltaic photodetector diodes (part of which is shown in FIG. 2 for three detector diodes in a linear array) using a layer 13 of suitable photosensitive material for the wavelengths of interest, such as a-Si for UV/visible images or other material for IR images. The image is focused on the focal-plane array 12 of photodetector diodes diodes with an optical lens 14.

In this example, the photovoltaic photodetector diodes of the array 12 consist of fully depleted PIN silicon detector diodes reticulated into an array of N×N pixels with 100% fill factor. Unit cell circuits comprising (high gain amplifiers), digital counters, an accumulator and means for multiplexing pixel bit data (bit 1 for each sample period of a unit cell during which an incident photon is detected) out to the digital counters, are produced in the silicon layer 10 and connected to the detector diodes of the array 12 by bump bonding as shown in FIG. 2 or by a method disclosed by Fossum et al. in U.S. Pat. No. 5,236,871 for producing a detector array in a layer of semiconductor material and integrated pixel readout circuitry in a separate layer of semiconductor material lifted off a substrate and bonded onto the focal-plane array after which interconnected channels are etched and plated to provide electrical connections to the pixels of the focal-plane array.

The technique of bump bonding is illustrated in FIG. 2 for the purpose of discussion as one example of an embodiment of the invention using as the focal-plane array a commercially available HAC PIN detector array that is commercially available and is readily bonded to a CMOS integrated circuit that is unique to this invention. In other words, the intent of this invention is not to provide a bonding technique between a focal-plane detector array of detector diodes and integrated circuitry, but rather to improve performance of the circuitry connected by hybrid bump bonding to the detector diodes in the focal-plane array where the focal-plane detector array is intended to be used for ultralow light level signal detection.

Figure 1B:
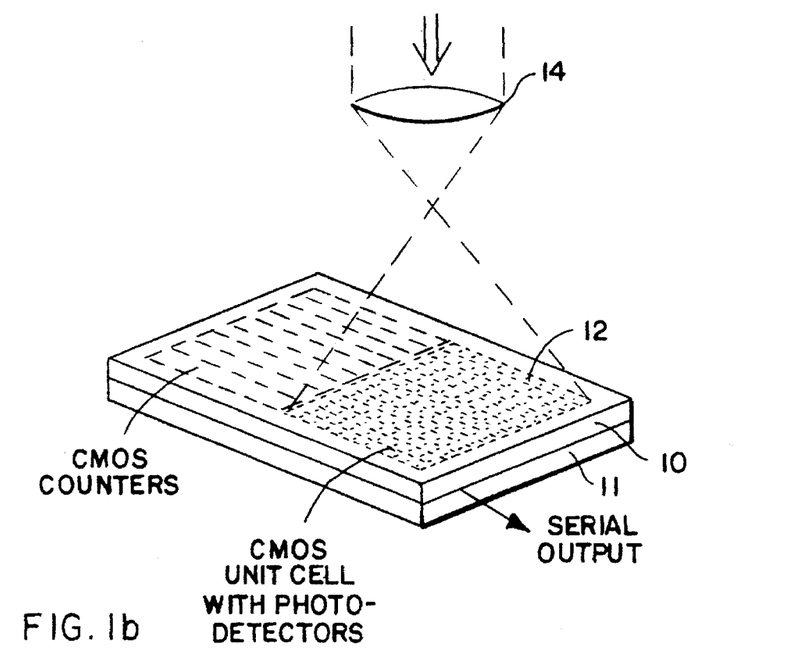

In applications that permit the detector diodes to be fabricated in a layer of silicon together with CMOS unit cells and other CMOS circuitry, the focal-plane array of N×N photodetector diodes may be interspersed with an array of CMOS unit cells, one detector diode directly connected to the input terminal of each separate one of the N×N array of unit cells, as illustrated in FIG. 1b. In either the case of FIG. 1a or FIG. 1b, a digital photon counter may be provided in a separate area away from the detector array for each unit cell interspersed as an integral part of each detector unit cell in the array, or one row of photon counters may be provided to one side of the detector array and be time shared with N rows of photodetector diodes in the array, and in either case, hybrid (FIG. 1a) or monolithic focal-plane array (FIG. 1b), each CMOS unit cell comprises a cascade of two high-gain (>1 mV/e$^-$), low-power (<1 μW per pixel average), ultra low noise buffer amplifier, each row of which may have a separate row of assigned digital counters or one row of digital counters time shared with N rows of unit cells at a cost of a more complex multiplexer. A digital CMOS accumulator (buffer memory) may be separately provided together with the digital counters with all necessary timing and control circuits for assembling a frame of pixel array data read out sequentially row by row from the digital counters after completion of an integration period for all rows of unit cells. As will become apparent from later discussion with reference to a time-sharing architecture, the CMOS unit cells and digital counters may be produced simultaneously as CMOS integrated circuitry together with the accumulator if desired on a part of the silicon semiconductor that extends beyond the array of N×N pixels as illustrated in FIG. 1a and FIG. 1b.

Figure 3:
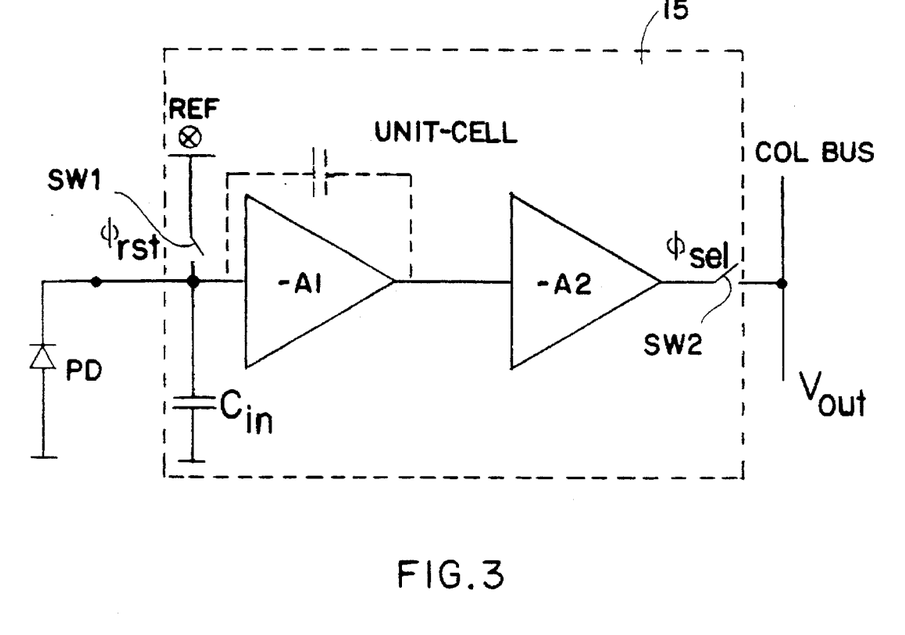
FIG. 3 is a basic schematic diagram of a unit cell for one photodetector diode of the solid-state array of FIG. 1a or FIG. 1b connected between a photovoltaic type of photodetector diode and a column bus for readout.

The intent of whichever fabrication method is chosen to provide a hybrid or a monolithic focal plane array is to connect the input terminal of each CMOS unit cell as directly to the output terminal of its photodetector diode PD as possible, as shown in FIG. 3, and to connect the output of each CMOS unit cell to a column bus through a selection switch, as shown in FIG. 3. That bus is shared with a column of counters, one counter for each CMOS unit cell in an N×N detector array. The separate counter assigned to each unit cell is selectively enabled by a multiplexer along with the selection switch. In a similar manner, one row of digital counters may be time shared with all rows of CMOS unit cells, and after each integration period for a row of CMOS unit cells, then transfer the count to a buffer memory.

FIG. 3 illustrates the basic schematic of a unit cell 15 of the solid-state photon-counting sensor under investigation, consisting of a photodetector diode (PD) and a cascade of two amplifiers A1 and A2, each with a high charge-to-voltage conversion gain (>1 mV/e$^-$), low power (<1 μW per pixel average) and ultralow noise (<1 e$^-$). A readout multiplexer (not shown) first momentarily closes a switch SW1 by a reset pulse $Q_{rst}$ to set the potential stored in a capacitor $C_{in}$ to a reference level REF and initiate an amplifier self-biasing phase. After a predetermined sampling period, a switch SW2 is closed to readout a binary signal from the cell. If at least one electron is incident on the photodetector PD during the sampling period, the output voltage of the amplifier A2 increases by at least the ΔV of the amplified change in the potential of the input capacitor (1 mV/e$^-$) resulting from one photon to photoelectron conversion.

The CMOS circuit of the unit cell 15 shown in FIG. 3 operates as follows. First the amplifier A1 of the unit cell and the photodetector diode PD connected to its input terminal are reset by a clock pulse $\phi_{rat}$ using switch SW1 to bias $C_{in}$ at a reference potential REF for the sampling (photon counting) mode. A photoelectron generated at the photodetector diode PD, changes the potential at the capacitance $C_{in}$. This potential is buffered by the high-gain amplifiers A1 and A2 to cause a large voltage change at the output of the amplifier A2, which is subsequently read out by selecting the unit cell through switch SW2 with a clock pulse $\phi_{sel}$ following a sampling period after the reset clock pulse has opened switch SW1 again. The unit-cell amplifiers are of high enough gain and low enough noise that the voltage change at the column bus ($\Delta V_{out}$) is sufficient to allow discrimination between presence or absence of photoelectrons in the capacitor $C_{in}$. Since the gain amplifiers A1 and A2 are required for boosting the $\Delta V_{out}$ signal enough to allow proper thresholding, gain uniformity in the amplifiers is not a concern. The high step voltage $\Delta V_{out}$ placed on the column bus by closing switch SW2 is differentiated at the counter selected from a column of counters by a multiplexer (not shown) that selects only the one counter associated with the one unit cell in the case of one counter for each cell or the only counter associated with a column of unit cells in the case of time sharing a row of counters with all rows of unit cells in the array. In either case, the counter differentiates the step voltage so that a trigger pulse if produced by the step in the voltage when the switch SW2 is closed. Thus, the pixel readout circuit permits counting of individual photoelectrons over a number of sampling periods between $Q_{sel}$ clock pulse cycles set by the multiplexer to produce a bit 1 output of amplifier A2 if at least one photon has been converted by the photodetector diode into one photoelectron which adds a potential 1 mV/e⁻ to the potential stored in the capacitor $C_{in}$.

The critical component in this sensor is the high-gain, ultra-low-noise, self-biased unit cell that enables solid-state photon counting with a high degree of spatial resolution, and a large dynamic range. The design requirements of the unit cell amplifiers will now be presented, followed by a description of two different topologies for the amplifiers.

The unit cell for counting of individual photons comprises cascaded buffer amplifiers A1 and A2 that exhibit the following characteristics: low-power (<1 μW per pixel average), high charge-to-voltage conversion gain (>1 mV/e⁻), low-noise (<1 e⁻), small cell pitch (<30 μm), easy scalability (to 10 μm), self-biasing capability, sufficient gain uniformity (~10%) for multiple event discrimination, and bias current programmability.

Biasing a high-gain CMOS circuit poses a considerable challenge due to the inherent threshold mismatches in CMOS transistors implemented in VLSI technology. Self-biasing capability is required to ensure that all the amplifiers remain biased in a high-gain mode in the presence of typical threshold mismatches of 10–20 mV. Total read noise consists of white noise and 1/f noise in the MOSFETS, as well as the so-called reset noise. Since correlated double-sampling readout cannot be generally used in this scheme for elimination of reset noise, the amplifier circuits require built-in reset noise reduction. A high charge-to-voltage conversion gain generally requires high voltage gain, typically around 60 dB. Although, gain uniformity is not critical, a high degree of gain uniformity is desirable.

Figure 4:
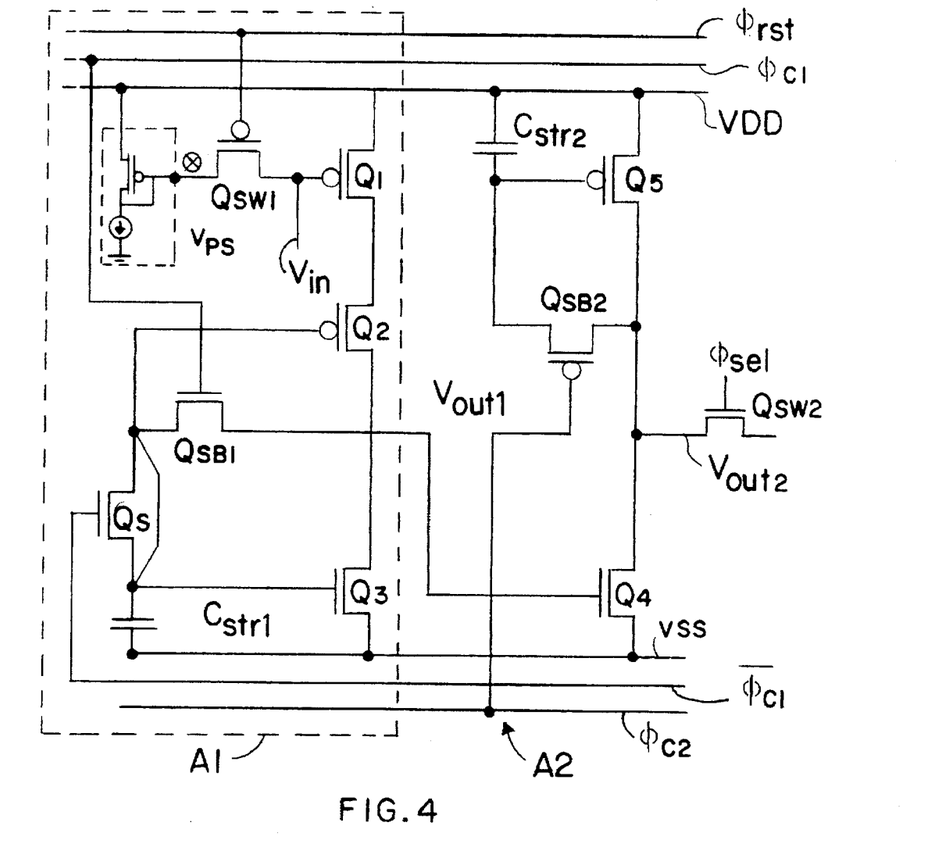
FIG. 4 is a schematic diagram of a CMOS implementation of the unit cell of FIG. 3 with a self-biased amplifier.

A schematic diagram of a unit-cell circuit is shown in FIG. 4 with a built-in dummy-switch compensated self-biasing. The circuit consists of two self-biased, cascode gain stages corresponding to cascaded amplifiers A1 and A2 shown in FIG. 3. The CMOS transistors Q1, Q2 and Q3 form the first cascode gain stage, with Q2 acting as the cascode transistor. The first stage is designed with a nominal gain of 37 dB and is cascaded to a similar but lower gain stage comprising transistor Q4 and Q5 (gain ~25 dB) that drives the column bus with $V_{out2}$ through a transistor switch SW2. Thus, cascoding allows minimization of coupling capacitance between input and output, thereby increasing the sensitivity of the circuit.

Figure 5:
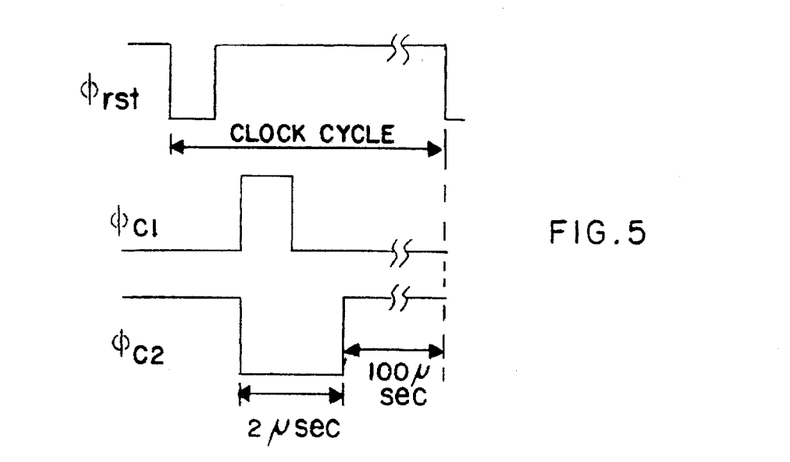
FIG. 5 is a timing diagram for the CMOS implementation of the unit cell of FIG. 4.

The amplifiers A1 and A2 operate as follows. First, the amplifier A1 and the photodetector diode PD connected to its input terminal $V_{in}$ are reset by pulse $\phi_{rat}$ (low) as shown in FIG. 5. This turns a transistor $Q_{SW1}$ on for a short period to bias the gate of transistor Q1 to a reference voltage $V_{bias}$ from a programmable source $V_{ps}$ which resets the input capacitance $C_{in}$ (FIG. 3) to the reference voltage through the input terminal $V_{in}$. This input capacitance is the total capacitance at the input terminal $V_{in}$ which includes photodetector diode, bump bond and parasitic capacitance. The reset phase is followed by a self-biasing phase during which the output $V_{out1}$ and $V_{out2}$ of amplifiers A1 and A2 are set to a d.c. level such that all the transistors Q1–Q5 operate in saturation mode, ensuring high-gain from the amplifiers. This is carried out in response to a pulse $\phi_{c1}$ (high) shown in FIG. 5 turning on a transistor $Q_{SB1}$ during which transistor Q3 operates with its gate and drain connected together by a shorted transistor $Q_s$. Note that this transistor $Q_s$ is driven by the clock pulse $Q_{c1}$ so that it does not conduct while transistor $Q_{SB1}$ conducts and vice versa. This results in a capacitor $C_{str1}$ at the gate of transistor Q3 to be charged up to the voltage necessary to maintain all MOSFETs of amplifier A1 to operate in saturation. When the clock pulse $\phi_{c1}$ goes low, the load bias generated during the self-biasing phase is frozen on the capacitance $C_{str1}$, and the first amplifier stage is biased in high-gain mode. To suppress biasing errors due to switch-feedthrough from $Q_{SB1}$ while it is being shut-off, a dummy transistor compensation is provided by the transistor $Q_s$ [C. Eichenberger and W. Guggenbuhl, "Dummy transistor compensation of analog MOS switches," *IEEE J. Solid-State Circuits*, Vol. 24, no. 4, p. 1143–1146, 1989]. The second stage is self-biased in a similar fashion by a pulse $\phi_{c2}$ (low) shown in FIG. 5 which turns on transistor $Q_{SB2}$ to set a bias potential in a capacitor $C_{SB2}$ to set a bias potential in a capacitor $C_{str2}$.

The self-biasing circuitry enables proper biasing despite the threshold mismatches and variations in the reset level of the input capacitance $C_{in}$. As a result, it allows unit cell operation with reduced reset noise, variation in the output reset level being dependent on the larger storage capacitance ($C_{str1}$) instead of the smaller input capacitance $C_{in}$ (FIG. 3). The first stage output-referred reset noise is approximately given by:

$$(v_{rst}^2) = \left(1 + \frac{1}{g_{m\ln}CR_{sw}}\right) \quad (1)$$

where $g_{Q3}$ is the transconductance of Q3 and $R_{sw}$ is the ON-resistance of the self-bias switch $Q_{SB1}$. Typically, $g_{Q3} \cdot R_{sw}$ is much less than unity and the reset noise is determined primarily by $C_{str1}$. From equation 1, the value of $C_{str1}$ is chosen to ensure that the reset noise is much less than the voltage step due to single electron input. The choice of $C_{str1}$ represents a compromise between cell size, speed of operation, and noise, and is designed to be 350 fF. The resultant dimensions of the two-stage amplifier is 48 μm×51 μm in 1.2 μm using CMOS technology.

Figure 6:
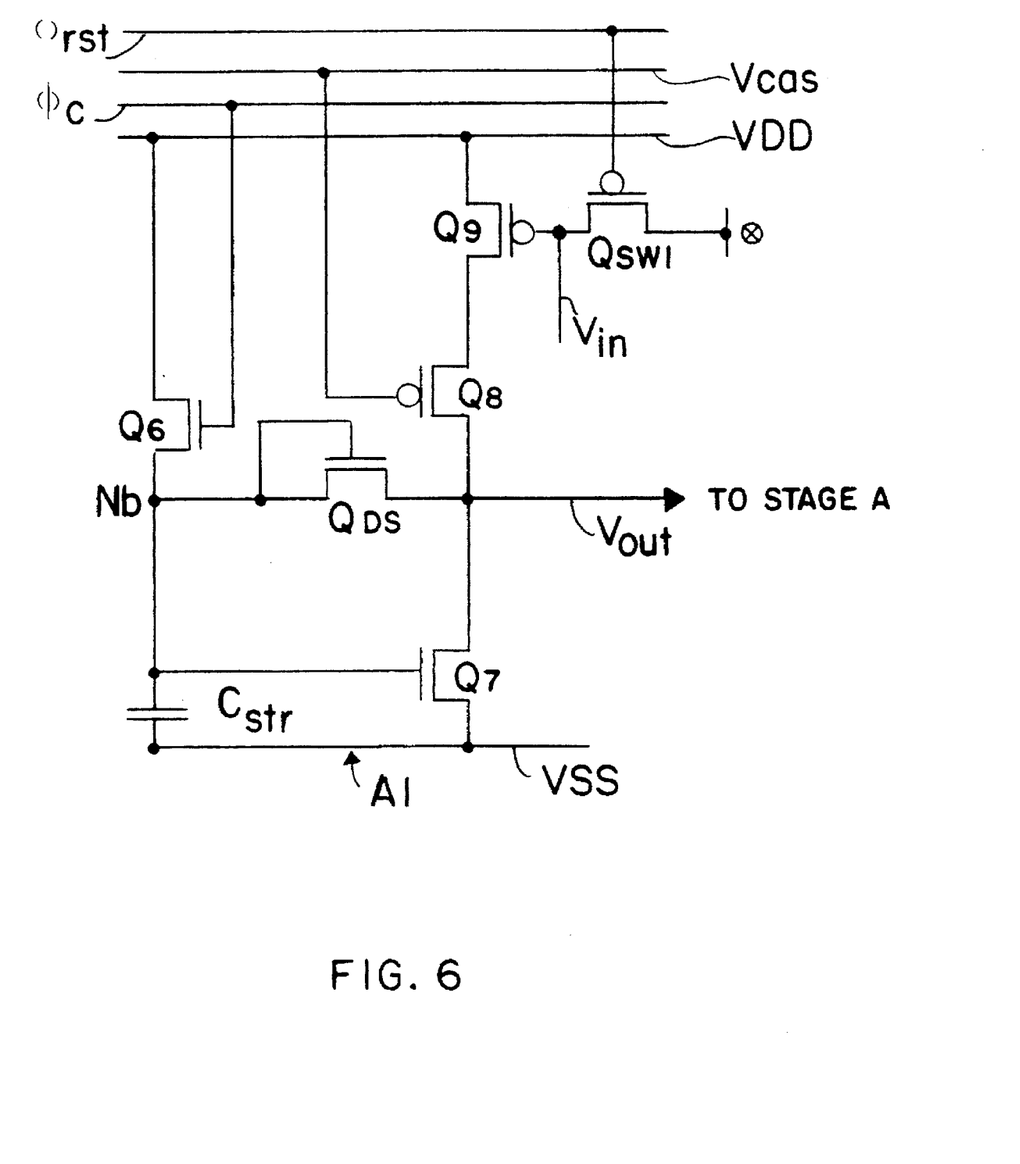
FIG. 6 is a schematic diagram of a second implementation of the first amplifier A1 of the unit cell shown in FIG. 3 with a simpler self-biasing scheme amplifier using a "diode shut-off switch" $Q_{DS}$ instead of a pulse driven "self-biasing switch" $Q_{SB1}$.

A second implementation of the high-gain amplifier A1 shown in FIG. 6 incorporates a novel and simpler self-biasing scheme. The second amplifier A2 remains the same as in FIG. 4. This second implementation of amplifier A1 features reduced cell size, fewer clocks, more reliable biasing, and faster biasing speeds. The self-biasing scheme consists of a diode-shut off switch, implemented with a gate-to-drain shorted MOSFET transistor $Q_{DS}$. The self-biasing phase requires only one clock, $\phi_{c1}$. In order to carry out self-biasing, $\phi_{c1}$ is pulsed high momentarily as in FIG. 5 to pull the node $N_b$ high through transistor $Q_b$ and charge the capacitor $C_{str}$ to a bias voltage $V_b$, while the output $V_{out1}$ remains at a low voltage, causing the transistor $Q_{DS}$ to be turned ON. When $\phi_{c1}$ goes low, the node $N_b$ discharges through the same transistor $Q_{DS}$ until no current flows through it. The current flow stops when the capacitor node $C_{str}$, which is also connected to the gate of the load transistor Q7, is at a potential that supports the bias current flow through the amplifier. As with the previous circuit, all transistors are in saturation at this point in the self-biasing phase, and the resultant bias voltage $V_b$ is the optimal load bias. The switch-feedthrough from $Q_{DS}$ is minimal because of the inherent self-limiting nature of transistor shut-off. With $C_{str} \sim 350$ fF, the cell size of this two-stage unit cell is 36 µm×36 µm in 1.2 µm using CMOS technology.

Figure 7:
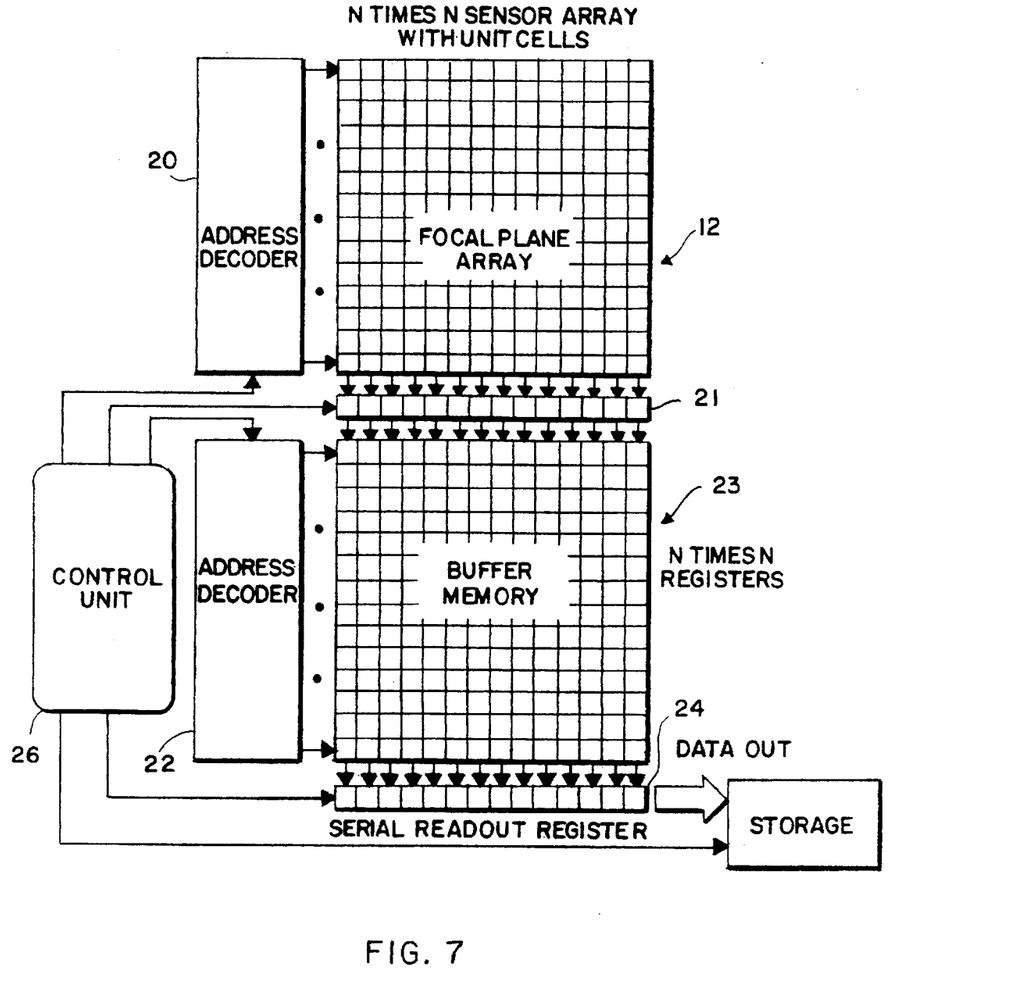
FIG. 7 illustrates schematically a hybrid architecture for the readout system of FIG. 1a and 1b.

FIG. 7 illustrates schematically a hybrid architecture for the readout system of FIGS. 1a and 1b for time sharing a single row of counters 21 with all N rows of photodetector diodes and respective buffer amplifiers using an address decoder 20 for gating CMOS unit cells to a row 21 of N time-shared digital counters which can be serially read out if desired and an address decoder 22 for gating the time shared row of counters into discrete rows of digital registers in a buffer memory 23. This arrangement of a CMOS unit cell provided in an integrated silicon chip, one unit cell for each pixel in the silicon chip area underneath the focal-plane array and time sharing one row 21 of photoelectron digital counters provides semiparallel periodic readout, while the buffer memory 23 provides an accumulator for extended storage. A row 24 of shift registers provides ultimate semiparallel periodic readout to a permanent storage device 25, which may be, for example, a reel of magnetic tape, all under control of a programmed control unit In the event a complete unit cell comprising a buffer amplifier and a 10-bit digital counter can be integrated in CMOS circuitry in the silicon area under each reticulated pixel area, the time shared row of counters 21 may be omitted. The decoders 20 and 22 normally coordinate control of the unit cells of the focal-plane array. Time shared counters 21 and the buffer memory 23 plus the readout shift register 24 under the control of the unit 26 would then need to coordinate the focal-plane array and counters together and the transfer of the contents of the digital counters to the buffer memory and from there to the output shift register 24 for extended memory also under control of the unit 26.

For a monolithic architecture comparable to that of the hybrid architecture in FIG. 7, there are virtually no constraints in the CMOS layout adopted. It would be possible to provide the CMOS unit cells and CMOS 10-bit counters in a single semiconductor layer with the PIN photodetector diode connected to the input terminal of the unit cells and the output terminals of the unit cells connected to the counters in another area of the semiconductor chip. The pixel counters may then be read out in sequence or in parallel row by row into the buffer memory. However, it would also be possible to time share a row of digital counters as in the hybrid structure. The advantage of the monolithic architecture is to be found not only in improved performance, but also in the ease of fabrication.

Although particular embodiments of the invention have been described and illustrated herein, it is recognized that modifications may readily occur to those skilled in the art. Consequently it is intended that the claims be interpreted to cover such modifications and equivalents thereof.

What is claimed is:

1. A solid-state photon-counting imaging device for ultralow light level detection comprising:

a layer of photosensitive material;

a source of reference potential;

a source of reference voltage charge;

an N×V array of photodetector diodes arranged in rows and columns in said layer of photosensitive material where each separate number N represents an integral number of rows and columns of photodetector diodes in said array and the number N of rows is independent of the number N of columns, each photodetector diode having a first terminal and a second terminal, said first terminal of every photodetector diode being connected to said source of reference potential;

control means for generating separately cyclical reset clock pulses and select clock pulses separated in time by a predetermined interval;

an array of high gain, low noise unit cells, one unit cell for each photodetector diode in every row of said N×N array of photodetectors in a VLSI focal-plane array on said layer of photosensitive material, each unit cell having an input terminal, a high-gain voltage amplifying means, a select switch, and an output terminal connected in series, and in that order, said input terminal of each unit cell being connected to said second terminal of a respective one of said photodetector diodes, and each unit cell further having a reset switch responsive to said reset clock pulses for resetting a voltage charge of input capacitance at said input terminal to a reference voltage charge common to all of said unit cells;

an array of digital counters, one digital counter for each photodetector diode in at least one row, each digital counter connected to said output terminal of a respective cell unit for counting voltage pulses occurring at said output terminal;

whereby each unit cell is prepared by said reset pulse for a possible event of a photon incident on a respective one of said photodetector diodes producing a photoelectron increased voltage charge of said input capacitance, said increased voltage charge being automatically amplified by said voltage amplifying means in order for it to be sampled through said select switch in response to said select pulse closing said select switch, thereby producing at said output terminal of a unit cell connected to a respective photodetector diode a voltage pulse to be counted by a respective one of said digital counters.

2. A solid-state photon-counting imaging device as defined in claim 1 wherein said array of digital counters is a linear array of N digital counters time shared with all rows of unit cells under control of said control means by selecting one row of unit cells at a time to receive a select pulse during each of N successive cycles of select pulses.

3. A solid-state photon-counting imaging device as defined in claim 11 for UV/visible imaging wherein said layer of photosensitive material is silicon and said focal-plane array of N×N photodetector diodes are produced in said silicon planar layer together with said unit cells in the form of CMOS circuitry as an integral part of said array of silicon photodetector diodes.

4. A solid-state photon-counting imaging device as defined in claim 3 wherein said layer of photosensitive material for imaging is selected for detection of photons in a wavelength band of interest and a planar layer of silicon for producing said CMOS circuitry is bonded to said selected layer of photosensitive material, one layer above the other, with a connection of said input terminal of each separate buffer amplifier in said planar layer of silicon to said first terminal of respective photosensitive diodes of said focal-plane array in said layer of photosensitive material, said CMOS circuitry being spaced on said layer of silicon with said input terminal of each unit cell adjacent to said second terminal of a respective photosensitive diode of said N×N array in order to facilitate providing a connection between said input terminal of said unit cells and said second terminal of said N×N array of photodetector diodes.

* * * * *